United States Patent

Frazee

[15] 3,664,893

[45] May 23, 1972

[54] FABRICATION OF FOUR-LAYER SWITCH WITH CONTROLLED BREAKOVER VOLTAGE

[72] Inventor: Orville Phillip Frazee, Phoenix, Ariz.

[73] Assignee: Motorola, Inc., Franklin Park, Ill.

[22] Filed: Dec. 9, 1968

[21] Appl. No.: 785,026

Related U.S. Application Data

[63] Continuation of Ser. No. 405,993, Oct. 23, 1964, abandoned.

[52] U.S. Cl. ..................................148/175, 29/571, 29/577, 117/201, 117/212, 148/33.5, 148/187, 317/235 R

[51] Int. Cl. .......................H01l 7/36, H01l 3/00, H01l 11/14

[58] Field of Search ..................148/1.5, 175, 33.5, 187–189; 317/234, 235; 117/201, 212; 29/571, 577

[56] References Cited

UNITED STATES PATENTS

| | | | |
|---|---|---|---|
| 3,146,135 | 8/1964 | Sah, Chih-Tang | 317/235 |
| 3,197,681 | 7/1965 | Broussard | 317/235 |
| 3,204,160 | 8/1965 | Sah, Chih-Tang | 317/235 |
| 3,223,904 | 12/1965 | Warner et al. | 317/235 |
| 3,243,669 | 3/1966 | Sah, Chih-Tang | 317/234 |
| 3,260,902 | 7/1966 | Porter | 317/235 |
| 3,321,745 | 5/1967 | Mansuetto et al. | 317/234 |
| 3,328,651 | 6/1967 | Miller | 317/235 |

OTHER PUBLICATIONS

Trumbore, F. A.; " Solid Solubilities of Impurity Elements in Germanium & Silicon," Bell System Technical Journal, January 1960, Vol. 39, pp. 205–234.

*Primary Examiner*—L. Dewayne Rutledge
*Assistant Examiner*—W. G. Saba
*Attorney*—Mueller & Aichele

[57] ABSTRACT

In a four layer switching device, either as a discrete device or as an integrated circuit which may be part of a memory device, a method is disclosed for reliably and consistently controlling the breakover voltage of the control junction during manufacture by diffusing an impurity into the surface of a layer of the opposite conductivity type semiconductor material to form such junction and continuing such diffusing until a solid state solubility concentration of said impurity in the material of said layer, at a predetermined temperature, is reached at the surface of such layer.

1 Claims, 19 Drawing Figures

Fig. I

INVENTOR.
Orville Phillip Frazee
BY Mueller & Aichele
ATT'YS.

INVENTOR.
Orville Phillip Frazee

BY Mueller & Aichele

ATT'YS.

INVENTOR.
Orville Phillip Frazee

BY Mueller & Aichele
ATT'YS.

INVENTOR.
Orville Phillip Frazee

BY Mueller & Aichele

ATT'YS.

INVENTOR.
Orville Phillip Frazee

BY Mueller & Aichele
ATT'YS.

INVENTOR.
Orville Phillip Frazee

BY
Mueller & Aichele

ATT'YS.

INVENTOR.
Orville Phillip Frazee

BY Mueller & Aichele

ATT'YS.

FABRICATION OF FOUR-LAYER SWITCH WITH CONTROLLED BREAKOVER VOLTAGE

This application is a continuation of application Ser. No. 405,993 entitled Fabrication of Four-Layer Switch With Controlled Breakover Voltage, filed on Oct. 23, 1964 in the name of Orville Phillip Frazee as inventor, now abandoned.

This invention relates to the semiconductor art and particularly to a four-layer semiconductor switch which is especially well-suited for use as a memory element in an integrated circuit memory system. The invention includes a method of making such semiconductor switches in integrated circuits and as discrete components.

Integrated circuits are finding increasingly wide use in electronic computers because of the fact that compared to conventional circuits they typically have smaller size, lower power consumption, higher speed and greater reliability. There are, however, no satisfactory integrated circuit memory systems; computers using integrated circuits employ conventional memory systems which use magnetic cores. Magnetic cores are inexpensive and have desirable remanence features, but they are not fully compatible with integrated circuits. The magnetic core systems require substantially larger current pulses for operation than are provided by the integrated circuits so that the current cannot be directly utilized in the core memory system. It is necessary to use a number of intermediate circuits between the memory systems and the integrated circuits so that the information may be exchanged. These intermediate circuits, which are called buffer stages, increase the cost and complexity of the computers. Moreover, they contribute nothing to the utility of the computer, being necessary only because the information cannot be exchanged directly between the integrated circuits and the magnetic core memory.

In the simpler types of magnetic core memories the stored information is destroyed when it is made available, or "read-out." This is a particularly objectionable feature of such core memory systems as the information is no longer available, if needed. Core memory systems with non-destructive read-out features are available, but these are more elaborate than the destructive read-out types. Compared to the integrated circuits to which they provide information, both the destructive and the non-destructive types of core memory systems are more cumbersome and require more power.

In the typical non-destructive read-out memory, two cores are required for each bit of information that is stored. In a 100,000-bit memory system, for example, 200,000 cores are required and several wires must be threaded in a particular manner through each core. Such systems are usually hand-wired, and the labor involved in the wiring is a major component of the over-all cost of a memory system.

It is an object of this invention to provide an integrated circuit memory system.

It is another object of this invention to provide a memory system which provides a non-destructive read-out without elaborate circuitry.

It is yet another object of this invention to provide a memory system which requires no buffer stages between integrated logic circuits and the memory system.

A feature of this invention is a four-layer semiconductor switch having four terminals, two of which may be electrically pulsed to turn the devices off or on.

Another feature of the invention is a four-layer semiconductor switch wherein a region with a solid solubility concentration of impurity is provided next to the middle junction so that the breakover voltage will be substantially uniform for all devices. This is advantageous both for discrete devices and for integrated circuits.

Another feature of this invention is a method of making a large quantity of four-layer devices on a single semiconductor wafer so that certain key characteristics are held to very close tolerances across the wafer; this feature allows the wafer to be made into a memory unit in the form of an integrated circuit.

Four-layer diodes and similar three and four electrode devices which are also known as four-layer switches are semiconductor devices having three PN junctions formed by four layers of semiconductor material may be either PNPN devices or NPNP devices. They are bistable switches in that they will remain indefinitely in either the on or the off state until they have been switched to the opposite condition.

Four-layer switches in accordance with this invention have a wide range of potential application since in addition to being used in memory circuits of both the integrated and non-integrated types, they are also suitable for such applications as to trigger silicon controlled rectifiers and to replace many two and three terminal four-layer devices.

One of the most important parameters of the four-layer switch is its breakover voltage. This is the voltage which must be applied across one of its junctions in order to switch the device. In the four-layer device there are three junctions; the second or central junction, called the break-over junction, determines the breakover voltage and it is across this junction that voltage must be applied in order to switch the device. The breakover voltage is closely related to the avalanche breakdown voltage of this junction, and, like it, it is determined by the bulk and/or surface resistivities on each side of the PN junction. By applying electrical connections to each layer of semiconductor material on either side of the breakover junction, voltage may be applied independently of the terminals at the first and fourth layers to switch the device off and on. With extra terminals it is possible to sense in the four-layer switch whether the device is in the on or the off state independently of one or both of the connections used to turn it off and on. It happens that this is a most useful property for a switching or information element in a non-destructive read-out memory system since it is not necessary in the device with this property to change the state of the device in order to sense whether it is on or off. Under these conditions, the information bit is always available without extra and special circuitry to prevent its destruction at read-out.

Figure 1:
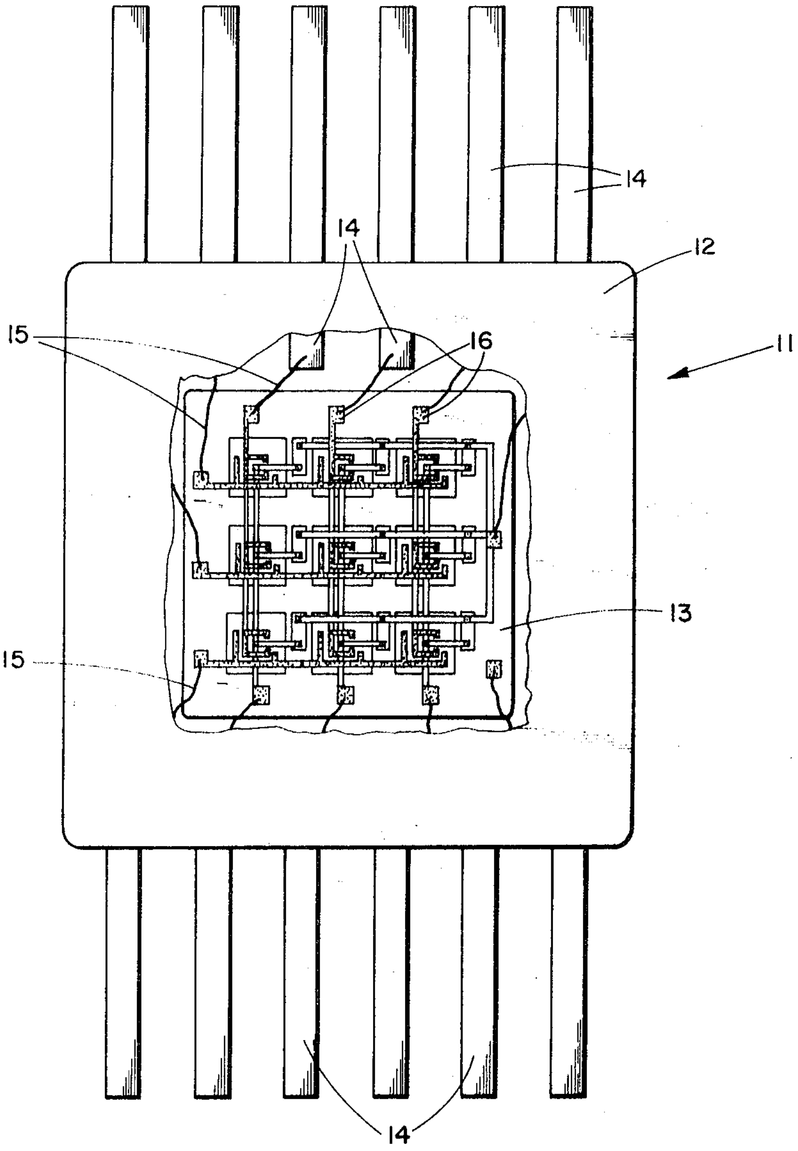
FIG. 1 is an embodiment of an integrated circuit memory in accordance with this invention.

In FIG. 1 is shown an embodiment of this invention which is a complete nine-bit integrated circuit memory system 11. An integrated circuit semiconductor unit 13 is shown mounted on a twelve lead header 12, the top of which is shown in cutaway view. The header and its top are made of an insulating material such as a ceramic or a glass, and when the two are sealed the hermetic enclosure formed serves to keep the semiconductor unit from contact with the outside atmosphere. Connection to the semiconductor unit is made through the header by the leads 14 and finally from the leads to the semiconductor unit 13 with fine aluminum wires 15 bonded to the leads 14 and to metal contact pads 16 on the semiconductor unit 13.

Figure 2:
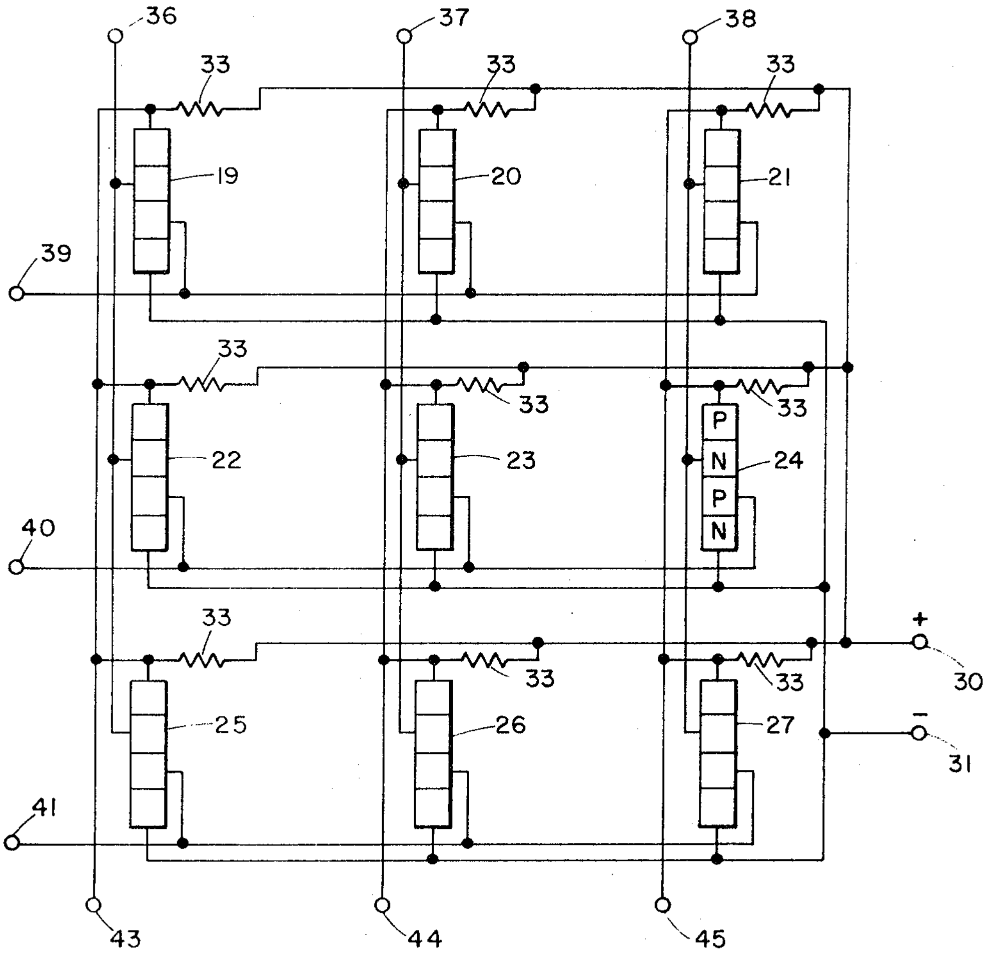
FIG. 2 is a schematic drawing of the electrical circuit of the memory of FIg. 1.

The circuit schematic drawing for this integrated circuit memory is shown in FIG. 2. This is a circuit for a memory system which permits non-destructive read-out and which uses as information elements in this embodiment, nine four-terminal fourmlayer devices 19, 20, 21, 22, 23, 24, 25, 26 and 27.

Using this circuit any good four-terminal four-layer devices could be used as the nine sensing elements so long as all elements are very carefully matched with respect to breakover voltage. The need for devices having matched breakover voltage characteristics will be explained further on. While matching of discrete devices by selection is possible, it is obviously not well-suited for the component devices of integrated circuits. It would be useless to simply prepare resistors and a multiplicity of conventional four-layer diode structures on a wafer of semiconductor material and then attach a connection to each layer since the electrical characteristics of the breakover junctions are not readily reproducible in prior processes used in fabricating these devices.

In prior four-layer diodes the breakover voltage necessary to turn the device on is difficult to establish accurately because of the fact that at least two separate diffusion steps are involved in producing the breakover junction. In the case of either the NPNP or the PNPN prior devices, there are, in the diffused regions forming the breakover junction, slight variations in surface concentration at the breakover junction and slight variations in the distribution of impurity within the semiconductor material which are normal with even the best of diffusion control. These variations cause such a difference in the breakover voltage characteristics from device to device as to make it practically impossible at the present state-of-the-art to adapt prior four-layer diode structures for such integrated circuit components.

However, in the four-terminal four-layer switches of this invention, one region of the semiconductor is grown epitaxially so as to have a reasonably uniform impurity concentration throughout. The other region is diffused to that solid solubility occurs at the surface of the semiconductor material, and, therefore, the surface concentration at this region is always constant. Where solid solubility exists, the concentration of impurity in the semiconductor is the maximum concentration which can be obtained at a particular diffusion temperature. Since the breakover voltage, like avalanche breakdown, is usually determined by the concentration of impurity at the surface portions of the PN junctions, breakover voltages of given values and close tolerances are readily made since the impurity concentrations at the surfaces of the semiconductor material on either side of the junction are substantially constant from device to device on a single wafer. Thus, when a large number of these devices are fabricated on a semiconductor wafer, it is quite probable that all devices are well-matched so that the wafer may be made into an integrated circuit memory unit.

Figure 3:
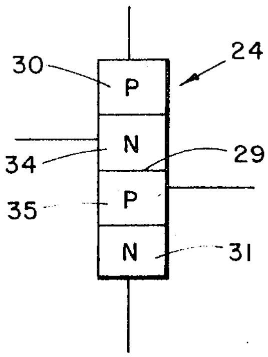
FIG. 3 is a schematic representation of one of the four layer switches included in the circuit of FIG. 2.

The operation of a four-layer switch in the memory circuit of FIG. 2 will be explained with reference to FIG. 2 and FIG. 3. FIG. 3 is a schematic representation of a single four-layer switch and for discussion will be considered as the switch numbered 24 in the circuit. To turn on the four-layer switch, i.e., change it from a high impedance device to a low impedance device, the breakover junction 29 must be reverse biased to a value which exceeds the breakover voltage as is the case with any four-layer device. In the four-terminal device, voltage applied to any combination of terminals that causes the voltage as measured across the breakover junction 29 to exceed the breakover voltage will switch the device 24 to its low impedance state. The device will remain in this state as long as a minimum current called the hold current flows across the breakover junction 29. The hold current is maintained by a biasing voltage $V_b$ applied to the first and fourth layers 30 and 31 respectively of the device through the current limiting resistor 33 as shown (FIG. 2).

The layers 34 and 35 of semiconductor material on either side of the breakover junction are connected to the *x* input terminals 36, 37 and 38 and *y* input terminals 39, 40, and 41 of the memory circuit as shown (FIG. 2).

Information may be stored in the memory circuit of FIG. 2 by putting timed voltage pulses into any of the *x* inputs and the *y* inputs. These voltage pulses which will be called $V_x$ and $V_y$ are positive and negative voltages respectively, and since $V_X$ and $V_Y$ are applied on opposite sides of the intermediate PN junction to be broken over these voltages are additive for purposes of determining the breakover voltages. In other words, $V_X$ and $V_Y$ must be of such a value that as measured across a breakover junction: (1) their sum plus the bias voltage must be greater than the breakover voltage, i.e., $[V_b + V_x + V_y] > V_{BO}$ and (2) the value of either one of the input voltage pulses, plus the value of the bias voltage must be less than the value of the breakover voltage, i.e., $[V_b + V_x[ < V_{BO}$ and $[V_b + V_y] < V_{BO}$. Under these conditions, if the timed voltage pulses arrive at a particular device such as 24 at the same time, the breakover voltage will be exceeded and the device 24 will switch to the on condition. If they are timed so that they do not arrive at the device 24 together, i.e., concurrently, the breakover voltage is not exceeded across the junction 29 and the device 24 remains off. The property of being able to use timed pulses in this manner is known as the property of concurrence. In circuits where size is a major consideration utilization of the property of concurrence greatly simplifies and reduces the amount of circuitry necessary since it makes it possible for a few inputs to control a large number of devices. If this property were not utilized a particular set of inputs would be required for each device.

To utilize the property of concurrence in a system comprised of several switching devices such as device 24, it is absolutely essential that the breakover voltage of each device be almost the same as the others, i.e., that the devices be matched, the maximum variation in breakover voltage being ± 10 percent. If the breakover voltages of some devices in the circuit are very much larger than those of the others, then large pulses in the *x* and *y* inputs are necessary to trigger them on, and just one of these pulses, such as a *y* input pulse, for example, may be large enough to turn on one or more of the switches of lower breakover voltage, even though an *x* input pulse does not arrive concurrently at these low breakover voltage switches. This, of course, is intolerable since it puts false information into the memory.

When the pulses are timed so that switch 24 (FIG. 2) is turned on, the device is then in its low impedance state and hold current flows through the device to maintain it in that condition. To retrieve the information, i.e., to sense whether the device is in the on condition or not, a sensing pulse is sent through the *y* input terminal 40 and a measurement is made at read-out terminal 45. Since the device is in the low impedance state, current flows readily through the device from *y* input 40 to the read-out terminal 45 where it is sensed indicating the on state of the device 24. The levels of current and voltage associated with this sensing pulse are such that the state of the device is undisturbed and so that non-destructive read-out occurs.

The memory may be cleared of information by interrupting the bias voltage; this reduces the hold current to zero and therefore returns an on device to the off state.

While the embodiment of FIG. 2 is a nine-bit memory, the same general scheme may be used for a larger memory. To make a 100-bit memory, for example, 100 switches would be arranged with 100 resistors into 10 rows and 10 columns in the same manner as the three rows and three columns shown in FIG. 2. The four-layer devices of an integrated circuit memory may be connected in a variety of ways provided the breakover voltage is substantially the same from device to device on the integrated circuit.

Figure 4:
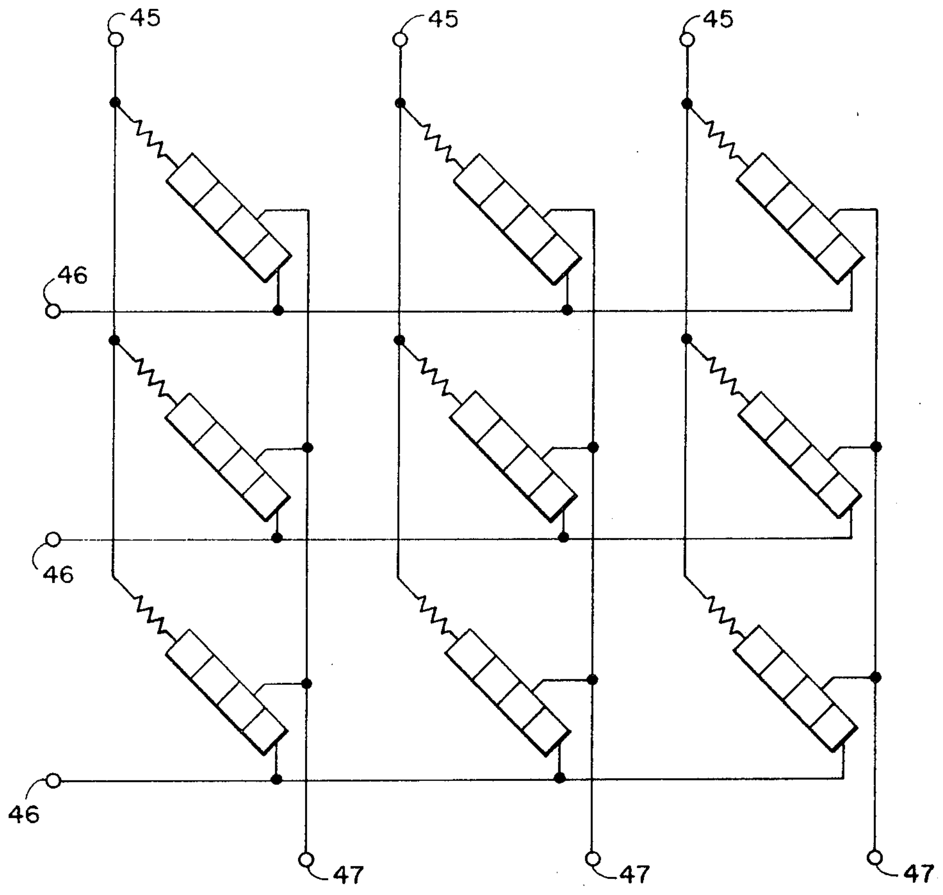
FIG. 4 is a schematic drawing similar to FIG. 2, but showing an alternate circuit in which only three of the four terminals of each switching device are utilized.

One method in which only three of the four terminals are employed is shown in FIG. 4. In this circuit the biasing voltage $V_b$ is sustained on the *x* and *y* input terminals 45 and 46. Concurrent *x* and *y* pulses at a device turn it on as in the circuit of FIG. 2, and read-out is accomplished by measuring at terminal 47, the sensing current flowing between *y* inputs and the read-out terminals 47, in the same manner as is described for the circuit of FIG. 2.

Figure 5:
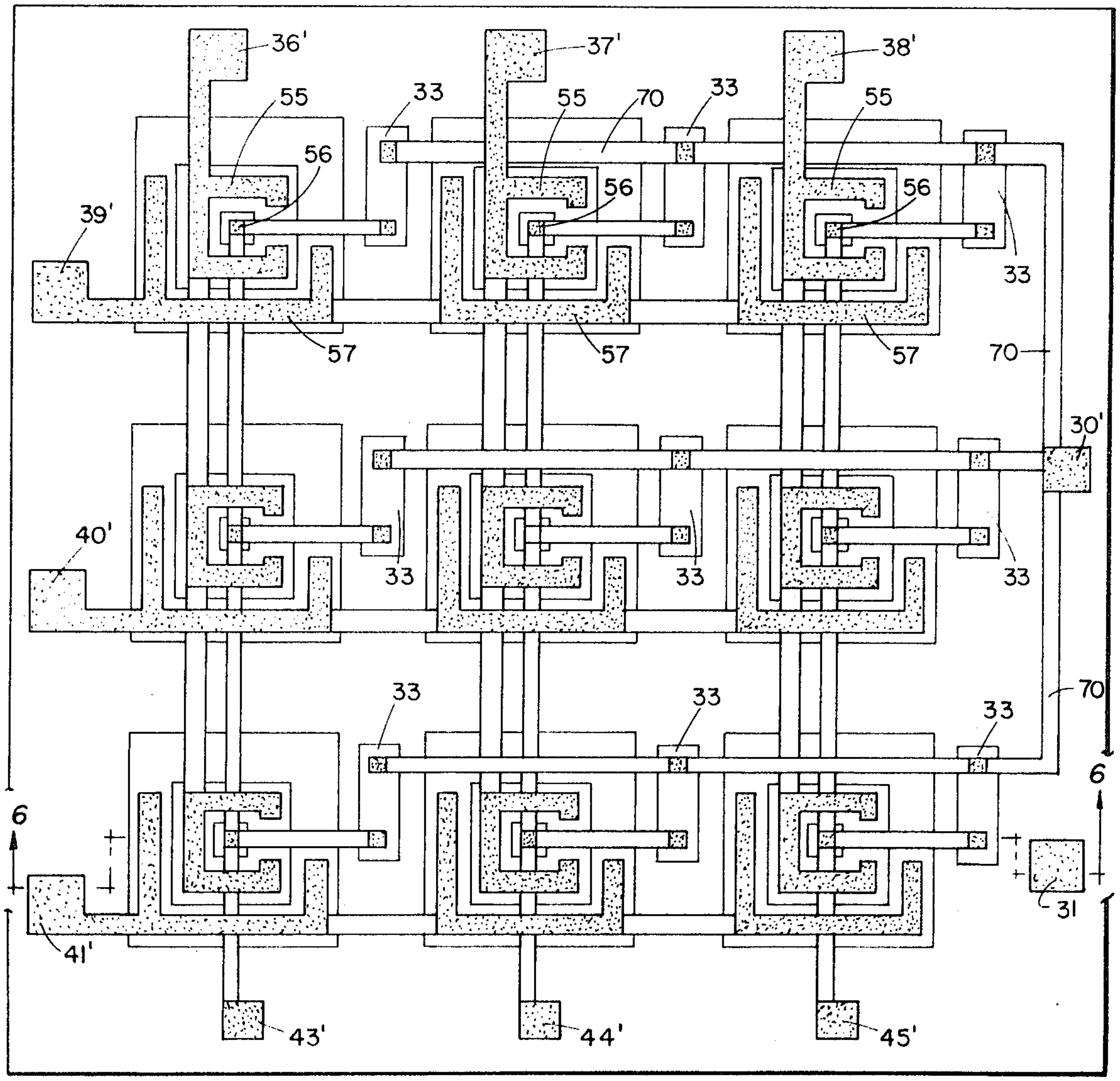
FIG. 5 is a top plan view of one semiconductor unit of the integrated circuit memory of FIG. 1, the semiconductor unit being greatly enlarged as compared to FIG. 1.
Figure 6:
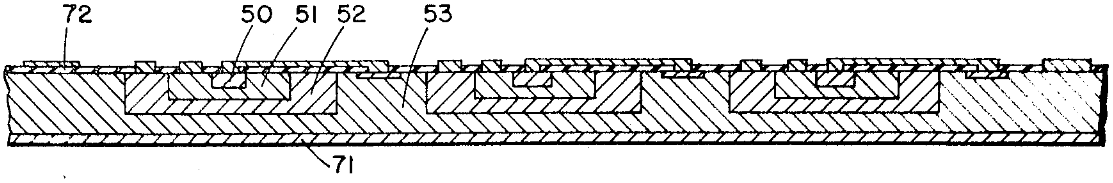
FIG. 6 is a cross sectional view of the semiconductor unit of FIG. 5 taken along line 6—6.

The silicon semiconductor unit of the integrated circuit memory of FIG. 1 is shown greatly enlarged in top view in FIG. 5 and in cross section in FIG. 6. The first, second and third layers 50, 51 and 52 of each of the nine four-layer switches are discrete while the fourth layer 53 is common to all nine switches (FIG. 6). The layers of the semiconductor unit are established by solid state diffusion processes as will be described later in connection with FIG. 10. In this embodiment which uses PNPN switches, the first and third layers are P type conductivity regions, while the second and fourth layers are N type conductivity regions. The circuit would work equally well if NPNP switches were substituted, in which case the opposite conductivity types would be used in the corresponding layers.

The current limiting resistors 33 as shown in FIG. 5 may be formed as thin films, if desired, but in this embodiment, they are made by solid state diffusion.

The strips of metal 36', 37' and 38' are the $x$ inputs and are connected to the metal contacts 55 of the second layers 51 of the switches. The strips of metal 39', 40' and 41' are the $y$ inputs and these are connected to the metal contacts 57 of the third layers. The strips of metal 43', 44' and 45' are for readout and are connected to the metal contacts of the first layers 56 and the current limiting resistors 33. The metal strip 70 supplies bias to the switches through the current limiting resistors 33 to which they are connected. The metal contact 30' is electrically common with the strip 70, and an electrical connector such as a wire may be bonded to the contact. The bottom surface of the silicon semiconductor unit of FIG. 6 is covered with metal 71 to allow the semiconductor unit to be soldered to the bottom of the header of FIG. 1. There is a metal contact 31 to provide bias to the fourth layer 53 which is common to all of the switches.

Except in the metallized regions where contact is made to the components, the upper surface of the semiconductor unit is covered with a film of silicon dioxide which electrically insulates the strips from the underlying silicon surface. Thin films of silicon monoxide (not shown) between metal strips which cross prevent these strips from shorting to one another at the crossover areas.

Figure 7:
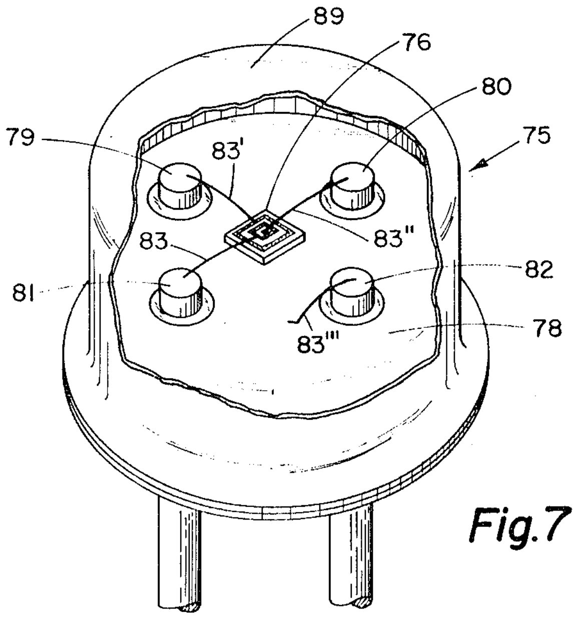
FIG. 7 is a cutaway view of a discrete semiconductor switching device which is another embodiment of the invention.
Figure 8:
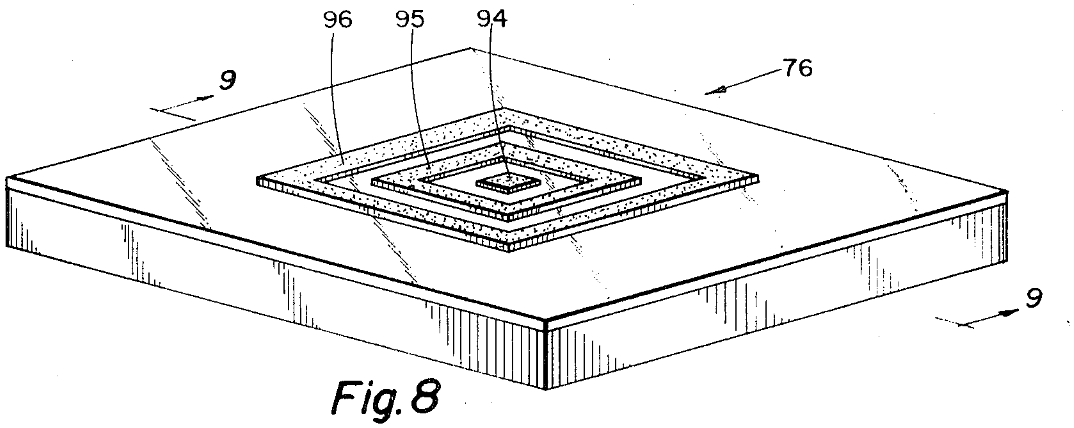
FIG. 8 is an enlarged isometric view of the semiconductor unit of the device of FIG. 7.
Figure 9:
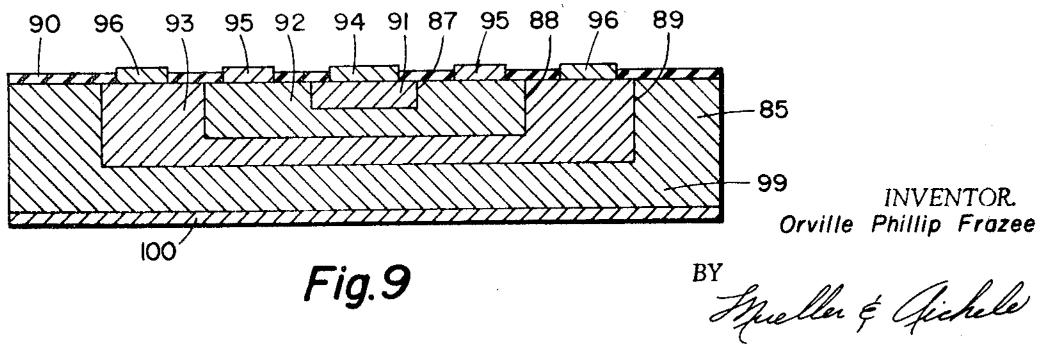
FIG. 9 is a cross sectional view taken along line 9-9 of FIG. 8, but to a scale different from that of FIG. 8.

An embodiment of the four-layer switch is shown in FIG. 7. In the device 75, the semiconductor unit 76 is essentially the same as any one of the four-layer switches of the integrated circuit semiconductor unit of FIG. 5 and is bonded to a metal header 78 of the glass-to-metal seal type having four leads 79, 80, 81 and 82, three of which are connected by fine wires 83, 83' and 83'' to metal electrodes on a surface of the semiconductor active unit and the fourth of which is grounded by a small wire 83''' connected between the lead 82 and the body of the header 78. The cap 89 shown cut away is welded to the header body 78 and forms a hermetic seal environment about the semiconductor unit. The semiconductor unit 76 is shown even more greatly enlarged in FIG. 8 and in cross section along line 9—9 in FIG. 9. The semiconductor unit 76 is a small silicon die having first, second and third PN junctions, 87, 88 and 89 respectively. These junctions 87, 88 and 89 are covered at their terminations at the surface of the silicon die by a passivating film 90 of silicon oxide. Connections to the first, second and third regions 91, 92 and 93 respectively of the semiconductor die are made by means of the small square aluminum electrode 94 and the square-ring aluminum electrodes 95 and 96 which are concentric about electrode 94. Electrical connection to the fourth layer 99 of the semiconductor die is made through a metal region 100 which has been evaporated on the bottom of the die. The four-layer structure of the embodiment of FIGS. 8 and 9 is not difficult to make. The processing steps for the semiconductor unit of this embodiment and of the integrated circuit semiconductor unit of FIG. 5 are the same except that in the case of the integrated circuit, an extra diffusion step is required to form the current limiting resistors, and there are extra steps to provide the kind of metallization required for the various connections.

For convenience, the fabrication of four-layer semiconducting switches will be discussed first, since this requires fewer steps than the semiconducting unit of the integrated circuit memory. The latter unit is comprised of multiples of the four-layer switches fabricated simultaneously into a single silicon wafer by solid state diffusion procedures, along with the necessary current limiting resistors, all being connected in a manner such as is described for FIG. 6.

Figure 10A:
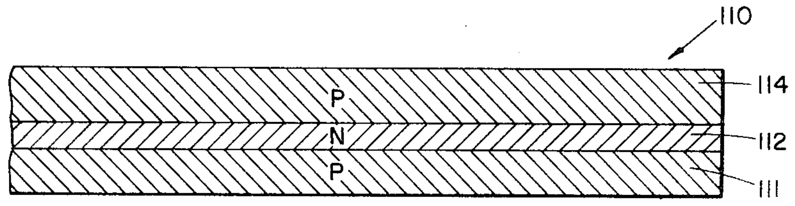
FIG. 10 is a series of views (10A through 10J) showing the steps of making semiconductor units in accordance with the invention.

The fabrication begins with the provision of a wafer-shaped substrate 111 of P type conductivity silicon on which are grown epitaxially a layer of N type silicon 112, and then a layer 114 of P type silicon as shown in FIG. 10A.

Epitaxial growth techniques are widely used in semiconductor manufacture. The growth of the epitaxial layers 112 and 114 is accomplished by depositing of silicon from silicon vapors produced from the hydrogen reduction of a silicon compound such as silicon tetrachloride ($SiCl_4$). Volatile N or P type impurity is added to the silicon vapor during the process so that the epitaxial material grown contains a uniform distribution of doping impurity throughout it. Typical conditions for the epitaxial growth are: In a combustion type tube furnace, the silicon substrate is heated to about 1,100° C. while a gaseous mixture of silicon tetrachloride containing an appropriate concentration of a P type dopant from a source such as diborane, or of an N type dopant from a source such as phosphine, flows together with hydrogen over the silicon substrate. In this environment uniformly doped layers of P or N type silicon are deposited over the surface of the substrate. This processing is explained in detail in U.S. Pat. No. 3,173,814 filed Jan. 24, 1962 and issued to John T. Law on Mar. 16, 1965 assigned to the present assignee. The composite of the layers 112 and 114 and the substrate 111 will be referred to as wafer 110.

Four-layer devices in accordance with this invention are prepared in lots of 100 or more on each wafer of silicon. For convenience in the drawings, FIG. 10A through 10J, enough of a wafer 110 is shown to illustrate the fabrication of a single semiconductor unit.

Figure 10B:
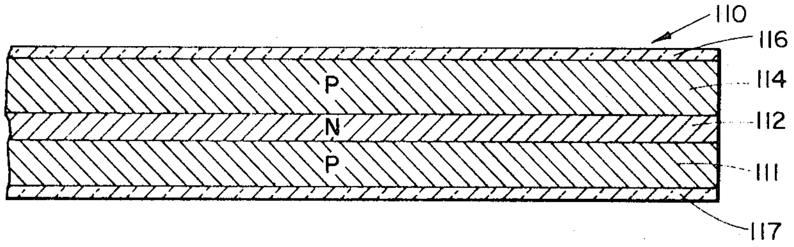
Figure 10C:
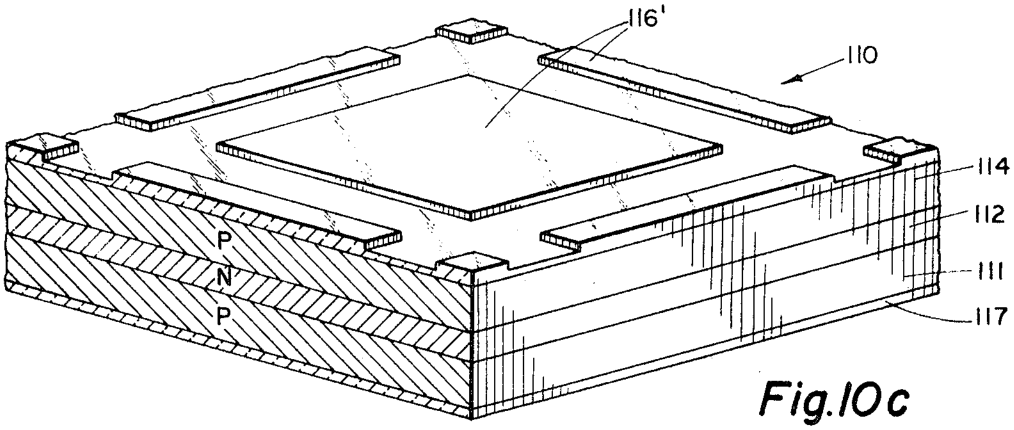
Figure 10D:
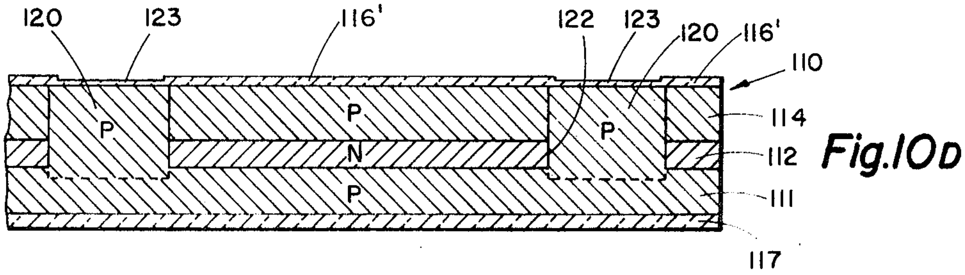

Layers 116 and 117 of silicon dioxide about 2,500 angstrom units thick are formed on the top and the bottom surfaces of the silicon wafer as shown in FIG. 10B. A portion of the top layer 116 of silicon dioxide is etched away using well-known photolithographic masking and etching techniques to form the pattern shown in FIG. 10C. This is in preparation for a subsequent selective diffusion step in which the silicon dioxide acts as a mask against the diffusion of impurity so that only the regions where the oxide is stripped away are diffused.

Figure 10E:
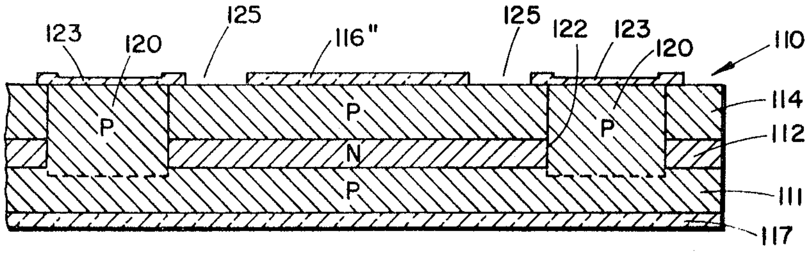
Figure 10F:
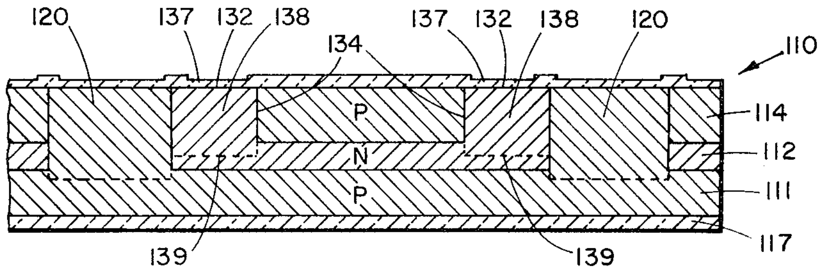
Figure 10G:
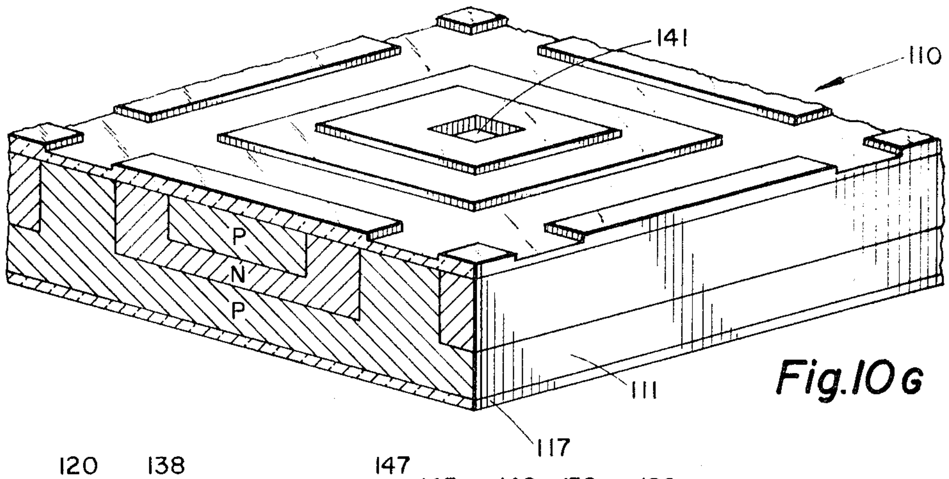

Subsequently, boron is diffused into the wafer to form the P region 120 (FIG. 10D) which joins the P type substrate 111 of wafer 110 and defines one of the PN junctions 122 of the four-layer switch. During the diffusion step, oxide 123 is regrown over the diffused region. A portion of the oxide 116' is then etched away as shown in FIG. 10E to form the opening 125. This is in preparation for another selective diffusion step.

In the next step (FIG. 10F), phosphorus is diffused into the silicon through the opening 125 to form the N region 138. The diffusion is such that a particularly heavy concentration of phosphorus impurity accumulates at the surface 132 of the silicon so that solid solubility is achieved with the phosphorus impurity in the silicon at the surface. Under these circumstances, the phosphorus concentration at the surface and just below will always be a constant value. This diffusion establishes the breakover PN junctions 134. Since the surface concentration of impurity in the N or phosphorus-diffused side of the junction is constant and the concentration of P type impurity on that side of the junction formed by epitaxial growth is relatively constant, the breakover voltage for this junction, which is determined by these concentrations at the surface, will be substantially the same from device to device on a single substrate, the tolerances being ± 10 percent. It is this feature which controls breakover voltage so closely, therefore, and which is not present in other methods, which makes feasible an integrated circuit memory having the property of concurrence as previously mentioned. It is also useful in making discrete devices since production output may be more closely specified and only devices having the desired breakover characteristics need be manufactured. During the phosphorus diffusion, a film 137 of phosphosilicate glass is formed which recovers the regions of the silicon in the areas where the silicon oxide which previously was etched away. The diffusion is continued sufficiently long that the material at 138 is converted to N type to join the N type layer 112 at the dashed line 139.

Again, using photolithographic masking and etching methods, an opening 141 (FIG. 10G) is etched to expose the surface of the silicon. This region is essentially centered over the underlying P region 142, FIG. 10H.

Figure 10H:
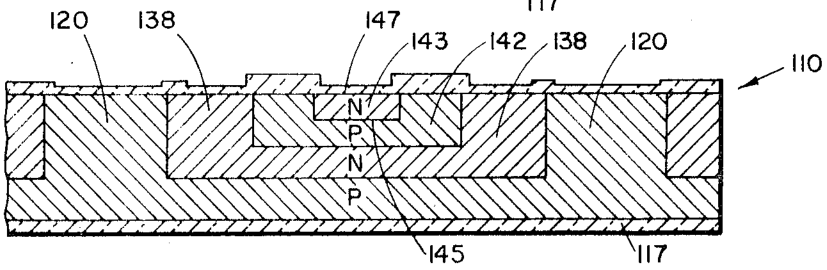
Figure 10I:
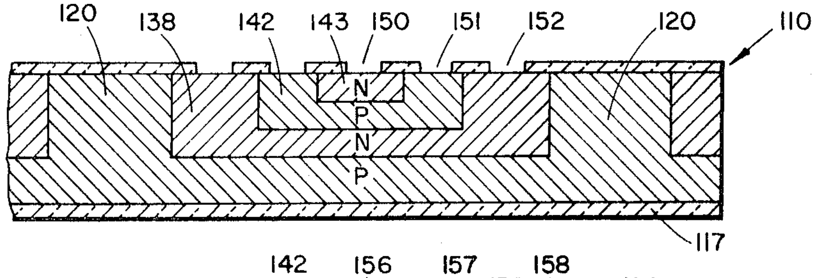

A short phosphorus diffusion is then performed to form the region 143 which constitutes the first layer of the four-layer semiconductor switch. The first junction 145 is so formed and is shown in FIG. 10H. During this diffusion a layer of phosphosilicate glass 147 forms over the surface of the silicon covering the exposed surface of the silicon again.

Figure 10J:
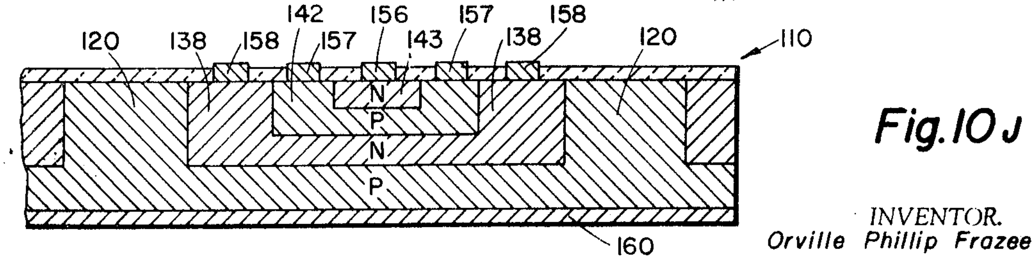

A third and final selective photolithographic etching step is performed to make openings 150, 151 and 152 in the oxide over the first, second and third regions 143, 142 and 138 of the silicon semiconductor unit as shown in FIG. 101. Aluminum electrodes 156, 157 and 158 are then deposited on the wafer in these open regions as indicated in FIG. 10J. All of the oxide 117 is removed from the opposite surface of the wafer and gold 160 is deposited on the silicon. In the subsequent steps, which are not illustrated, the wafer is cut into semiconductor units 76 as shown in FIG. 8 and these are mounted in a soldering operation to the header 78 as shown in FIG. 7. During the soldering operation, the semiconductor unit 76 rests on the gold plated header 78 and both are raised to a temperature above 375° C. Since the gold and silicon are in intimate contact, the gold alloys with the silicon and the semiconductor unit 76 is thereby bonded to the header 78. Electrical connections are then made, and the device is hermetically sealed by welding the cap 89 onto the header 78 as described for FIGS. 7 and 8. Then the four-terminal four-layer switch is completed and tested electrically.

The fabrication of the integrated circuit on a wafer of silicon differs only slightly from the fabrication of the discrete four-layer device. The steps are identical through the diffusion of the first-layer region 143 (FIG. 10H).

The process differs in subsequent steps only in that current limiting resistors 33, FIG. 2 and FIG. 5, are added, being formed by solid state diffusion. Metallized contacts to the regions 120, 138, 142 and 143 of each of the individual devices such as the one shown in FIG. 10J are added in the form of thin films of evaporated aluminum. Metal contacts are also provided for the current limiting resistors and the elements of the semiconducting integrated circuit are interconnected as described for FIGS. 5 and 6. The semiconductor unit 13 is then mounted, connected and sealed to form the integrated circuit memory shown in FIG. 1.

Discrete four-layer devices prepared in accordance with this invention constitute an improvement over prior devices in that they have four terminals, and may therefore be used to replace two and three terminal four-layer devices which are otherwise equivalent. They are also suitable for incorporation into electrical circuits such as memory circuits in which all four terminals are utilized.

The method of preparing the breakover junctions is suitable for two, three and four terminal devices and allows them to be manufactured to tighter specifications for breakover voltage. This results in a substantially higher production line yield of good four-layer devices.

The integrated circuit memory systems in accordance with this invention are, in fact, possible because of the method of preparing the breakover junctions. Because the breakover voltage is substantially uniform from switch to switch, the integrated circuits have the very desirable property of concurrence which they would not have if the breakover voltage varied substantially.

I claim:

1. A method of making a semiconductor switching device having a principal surface and having a controlled breakover voltage of one of its PN junctions which includes the steps of:

a. epitaxially depositing a first semiconductor layer of one conductivity type semiconductor material on a semiconductor substrate of the opposite conductivity type semiconductor material,
b. epitaxially depositing a second semiconductor layer of said opposite conductivity type semiconductor material on said first layer,
c. forming a protective coating on said second semiconductor layer,
d. selectively removing portions of said protective coating to thereby expose a first area of said second layer,
e. diffusing an impurity of opposite conductivity type through said first area of said second layer and through said first and second layers and into said semiconductor substrate to thereby extend a first PN junction to said principal surface of said semiconductor device,
f. reforming said coating over the presently exposed areas of said principal surface of said semiconductor device,
g. selectively removing another portion of said protective coating on said second layer to thereby expose a second area of said second layer,
h. diffusing an impurity of said one conductivity type through said second area of said second semiconductor layer and into said first semiconductor layer to thereby extend a second PN junction to said principal surface of said semiconductor device,
i. reforming a protective coating over the presently-exposed portions of said principal surface of said semiconductor device,
j. selectively removing another portion of said coating on said second layer to thereby expose a third area of said second layer,
k. diffusing an impurity of said one conductivity type through said third area and into only a selected region within said second semiconductor layer to thereby form a third PN junction of said device,
l. continuing the diffusing of said step (h) until a solid solubility concentration of said impurity in the material of said second semiconductor layer at a predetermined temperature is reached at said principal surface as a control of the breakover voltage of said second PN junction for a plurality of semiconductor devices fabricated simultaneously by said method,
m. reforming a protective coating over the exposed areas of said principal surface of said semiconductor device after said third PN junction is formed,
n. removing additional portions of said coating overlying selected contact areas of each of the P and N conductivity type layers of said device, and
o. depositing metal electrodes on the now-exposed areas of said device to thereby form good ohmic electrical contact with each of the P and N type semiconductor regions extending to said semiconductor surface of said semiconductor device.

* * * * *